United States Patent
Suzuki et al.

(10) Patent No.: US 9,779,812 B1
(45) Date of Patent: Oct. 3, 2017

(54) SEMICONDUCTOR MEMORY DEVICE

(71) Applicant: TOSHIBA MEMORY CORPORATION, Minato-ku, Tokyo (JP)

(72) Inventors: Kunifumi Suzuki, Mie (JP); Kazuhiko Yamamoto, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/269,523

(22) Filed: Sep. 19, 2016

Related U.S. Application Data (60) Provisional application No. 62/309,684, filed on Mar. 17, 2016.

(51) Int. Cl.
*G11C 13/00* (2006.01)

(52) U.S. Cl.
CPC ...... *G11C 13/0069* (2013.01); *G11C 13/0064* (2013.01)

(58) Field of Classification Search
USPC ........................................................ 365/148
See application file for complete search history.

(56) References Cited

U.S. PATENT DOCUMENTS

| | | | | |
|---|---|---|---|---|
| 2010/0128520 | A1* | 5/2010 | Zheng | G11C 11/16 365/171 |
| 2013/0223131 | A1* | 8/2013 | Takagi | G11C 13/0007 365/148 |
| 2014/0071734 | A1* | 3/2014 | Sugimae | G11C 13/0002 365/148 |
| 2014/0078809 | A1* | 3/2014 | Katoh | H03K 3/0375 365/148 |
| 2014/0185360 | A1* | 7/2014 | Kawai | G11C 13/0007 365/148 |
| 2015/0255122 | A1 | 9/2015 | Toriyama | |

FOREIGN PATENT DOCUMENTS

| | | |
|---|---|---|
| JP | 2013-120845 A | 6/2013 |
| JP | 2013-197254 A | 9/2013 |

* cited by examiner

*Primary Examiner* — Hoai V Ho
*Assistant Examiner* — Minh Dinh
(74) *Attorney, Agent, or Firm* — Foley & Lardner LLP (57) ABSTRACT

According to one embodiment, a semiconductor memory device includes a first electrode, a second electrode, a memory cell, and a control circuit. The memory cell is provided between the first electrode and the second electrode, and includes a metal film and a resistance change film. The control circuit applies a voltage between the first electrode and the second electrode to transition a resistive state of the memory cell. The control circuit performs a first reset operation by applying a first pulse having a voltage of a first polarity to the memory cell, and applying a second pulse having a voltage of a second polarity that is an inverse of the first polarity to the memory cell after applying the first pulse.

15 Claims, 10 Drawing Sheets

FIG. 16

SEMICONDUCTOR MEMORY DEVICE

CROSS-REFERENCE TO RELATED APPLICATIONS

This application is based upon and claims the benefit of U.S. Provisional Patent Application No. 62/309,684, filed on Mar. 17, 2016, the entire contents of which are incorporated herein by reference.

FIELD

Embodiments described herein relate generally to a semiconductor memory device.

BACKGROUND

Description of the Related Art

As a semiconductor memory device that stores large capacity data for uses, attention has been focused on such as a resistive random access memory (ReRAM: Resistive RAM) that is easily formed three-dimensionally. As such resistive random access memory, CBRAM (Conduction Bridge RAM), for example, is used.

DETAILED DESCRIPTION

A semiconductor memory device according to one embodiment includes a first electrode, a second electrode, a memory cell, and a control circuit. The memory cell is provided between the first electrode and the second electrode, and includes a metal film and a resistance change film. The control circuit applies a voltage between the first electrode and the second electrode to perform transition of a resistive state of the memory cell. The control circuit performs a first reset operation by applying a first pulse to the memory cell and applying a second pulse to the memory cell after applying the first pulse. The first pulse has a voltage of a first polarity. The second pulse has a voltage of a second polarity that is an inverse of the first polarity.

Next, a description will be given of the semiconductor memory device according to the embodiments in detail with reference to the drawings. Here, these embodiments are only examples, and are not described for the purpose of limiting the present invention.

For example, the drawings used in the following embodiments are schematically illustrated. The thickness, the width, and the ratio of the layer, and the magnitude, the application time, and the ratio of the voltage, or similar parameter may be different from actual parameters.

In the following description, as a structure of a memory cell array, a configuration including one layer of memory mat is indicated as an example. However, the present invention may be applicable to a configuration including two or more laminated layers of memory mats. The present invention may also be applicable to a configuration with a bit line extending to a direction intersecting with a surface of a substrate, which is so-called VBL (Vertical Bit Line) type.

First Embodiment

[Overall Configuration]

Figure 1:
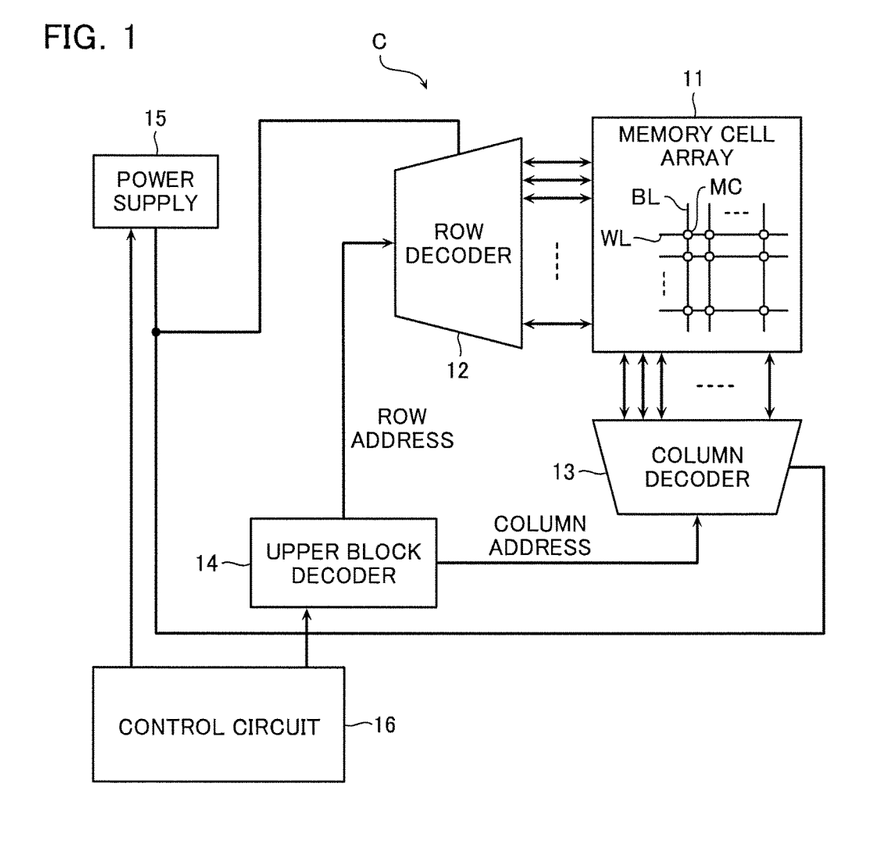
FIG. 1 is a block diagram illustrating a semiconductor memory device according to a first embodiment.

FIG. 1 is a block diagram of a semiconductor memory device according to a first embodiment. Here, the semiconductor memory device means, for example, a chip C that stores user data, an electronic device that includes the chip C (such as a smart phone, a mobile phone, a tablet terminal, a music player, and a wearable device), or the like. The user data is data to express, for example, contents used by a user (such as a character string, an audio, an image and a moving image), which are expressed by combinations of "0" and "1."

The chip C includes a memory cell array 11, a row decoder 12, a column decoder 13, an upper block decoder 14, a power supply 15, and a control circuit 16.

The memory cell array 11 includes a plurality of memory cells MC that store data of 1 bit or a plurality of bits. The memory cell array 11 is configured such that an access (data erasure/writing/reading) to a desired memory cell MC can be performed by applying a predetermined voltage to desired bit line BL and word line WL corresponding to address data.

The row decoder 12 selects one word line WL corresponding to a row address for access to apply the predetermined voltage.

The column decoder 13 selects one or the plurality of bit lines BL corresponding to a column address for access to apply the predetermined voltage. The column decoder 13 includes a sense amplifier circuit for detecting the current or the voltage of the bit line BL to determine the user data recorded on the memory cell MC.

The upper block decoder 14 generates the row address and the column address corresponding to the address data to supply to the row decoder 12 and the column decoder 13.

The power supply 15 generates combinations of the predetermined voltages corresponding to each operation of data erasure/writing/reading to supply to the row decoder 12 and the column decoder 13.

The control circuit 16 accepts external control signals from an external host (not illustrated) to control such as the upper block decoder 14 and the power supply 15.

Figure 2:
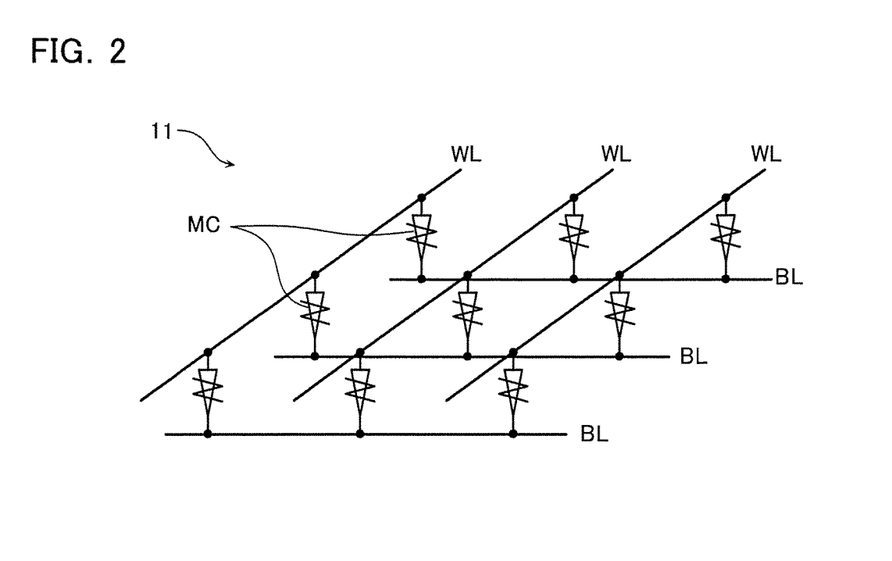
FIG. 2 is a circuit diagram illustrating a configuration of a memory cell array of the semiconductor memory device.

FIG. 2 is an equivalent circuit diagram illustrating a configuration of a part of the memory cell array 11.

The memory cell array 11 includes the plurality of bit lines BL (second wiring), the plurality of word lines WL (first wiring), and the plurality of memory cells MC connected to these bit lines BL and word lines WL. These memory cells MC are connected to the column decoder 13 via the bit line BL (FIG. 1) and to the row decoder 12 via the word line WL (FIG. 1). The plurality of memory cells MC connected to the common word lines WL store user data for one page, for example. The plurality of memory cells MC each store data for one bit, for example.

The memory cell MC serves as a variable resistive element to vary its resistance value corresponding to the stored data. For example, the memory cell MC that records "0" is in a high resistance state, and the memory cell MC that records "1" is in a low resistance state.

Figure 3:
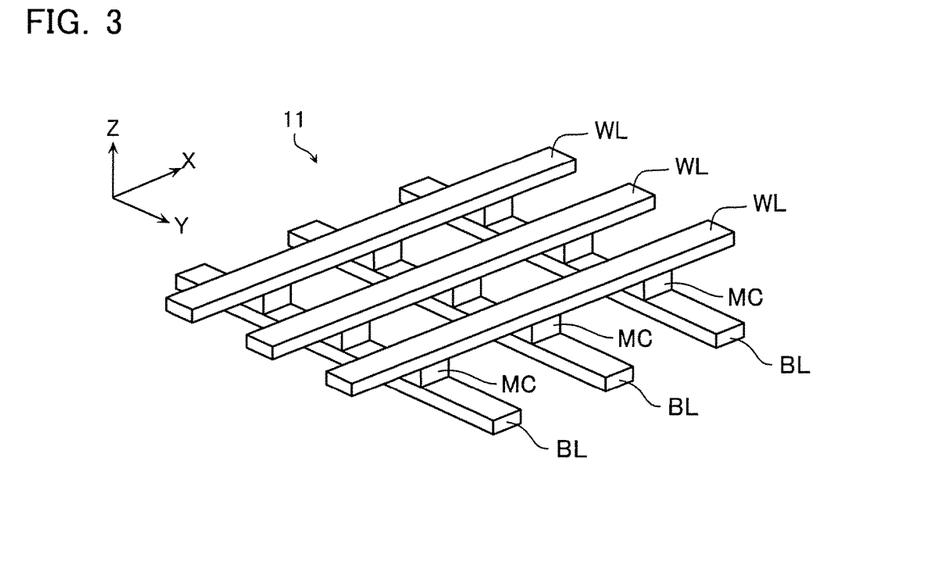
FIG. 3 is a perspective view illustrating the configuration of the memory cell array.

FIG. 3 is a schematic perspective view illustrating the configuration of a part of the memory cell array 11. FIG. 3 is a drawing for describing a three-dimensional structure of wirings, the memory cells MC, and similar part. Then, the interlayer insulating films provided such as between the wirings are not illustrated. FIG. 3 is a drawing for an explanation. Then, the specific configuration may be changed as necessary.

As illustrated in FIG. 3, the memory cell array 11 is, for example, what is called a cross-point type memory cell array. That is, in the memory cell array 11, a plurality of bit lines BL arranged in an X direction, provided in parallel and extending in a Y direction is provided. Above the plurality of bit lines BL, a plurality of word lines WL arranged in the Y direction, provided in parallel and extending in the X direction is provided. Furthermore, at the intersecting portions between the plurality of bit lines BL and the plurality of word lines WL, the respective memory cells MC are provided.

[Memory Cell MC]

Figure 4:
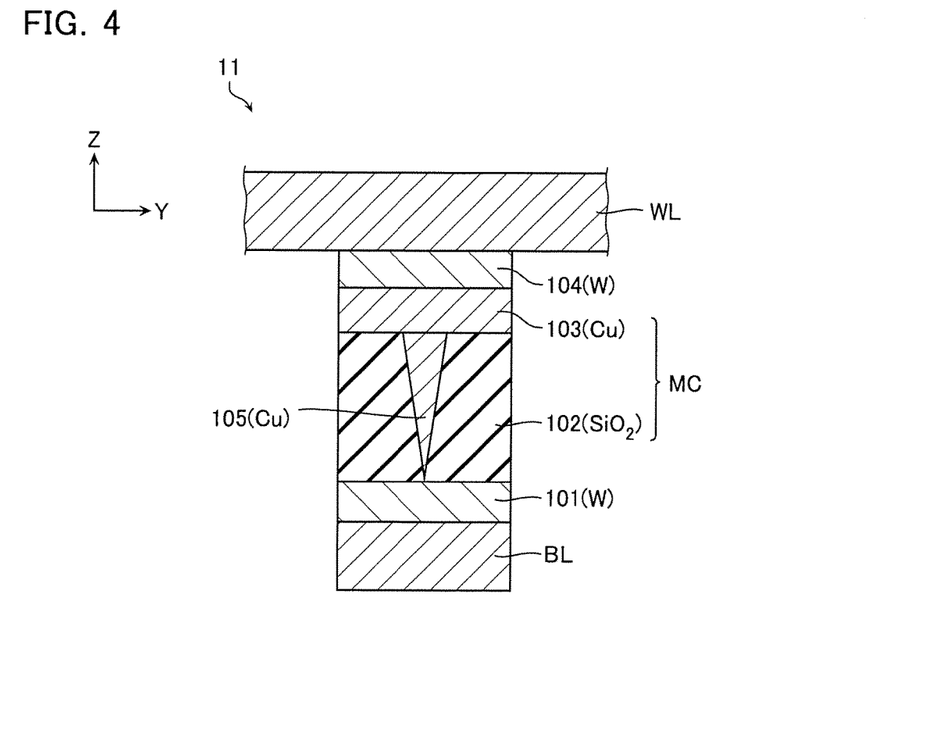
FIG. 4 is a cross-sectional view illustrating a configuration of a memory cell of the semiconductor memory device.

FIG. 4 is a cross-sectional view illustrating a configuration of a part of the memory cell MC. In FIG. 4, interlayer insulating films provided between the likes of the wirings or the like are not illustrated.

The memory cell MC is provided between a lower electrode 101 (cathode, the first electrode) connected to the bit line BL and an upper electrode 104 (anode, the second electrode) connected to the word line WL. The memory cell MC includes a resistance change film 102 provided between the lower electrode 101 and the upper electrode 104, and a metal film 103 provided between this resistance change film 102 and the upper electrode 104. The memory cell MC may be in two types of resistive states: a low resistance state and a high resistance state. In the low resistance state, a filament 105 is formed within the resistance change film 102 so as to penetrate the resistance change film 102. This filament 105 becomes a current path. In the high resistance state, the filament 105 is separated or disappears within the resistance change film 102, and the current path is not constituted.

The lower electrode 101 is formed of a conductive film, for example, tungsten (W). The lower electrode 101 is provided on a top surface of the bit line BL and serves as a cathode of the memory cell MC. The resistance change film 102 is provided between the lower electrode 101 and the metal film 103, and formed of, for example, oxide such as silicon oxide ($SiO_2$) or alumina ($Al_2O_3$), or nitride such as silicon nitride ($Si_3N_4$). The metal film 103 is provided between the resistance change film 102 and the upper electrode 104, and constituted of, for example, metal such as copper (Cu) or silver (Ag), or compound including one or more types of metallic element. As an example, the metal film 103 is described to be copper in the first embodiment. The metal film 103 supplies metal ions, which constitute the filament 105, into the resistance change film 102. The upper electrode 104 is formed of a conductive film, for example, tungsten (W). The upper electrode 104 is provided between the word line WL and the resistance change film 102 and serves as an anode of the memory cell MC. The filament 105 is made of metal ions such as copper ions ($Cu^+$) or silver ions ($Ag^{2+}$) supplied into the resistance change film 102 from the metal film 103.

Figure 5:
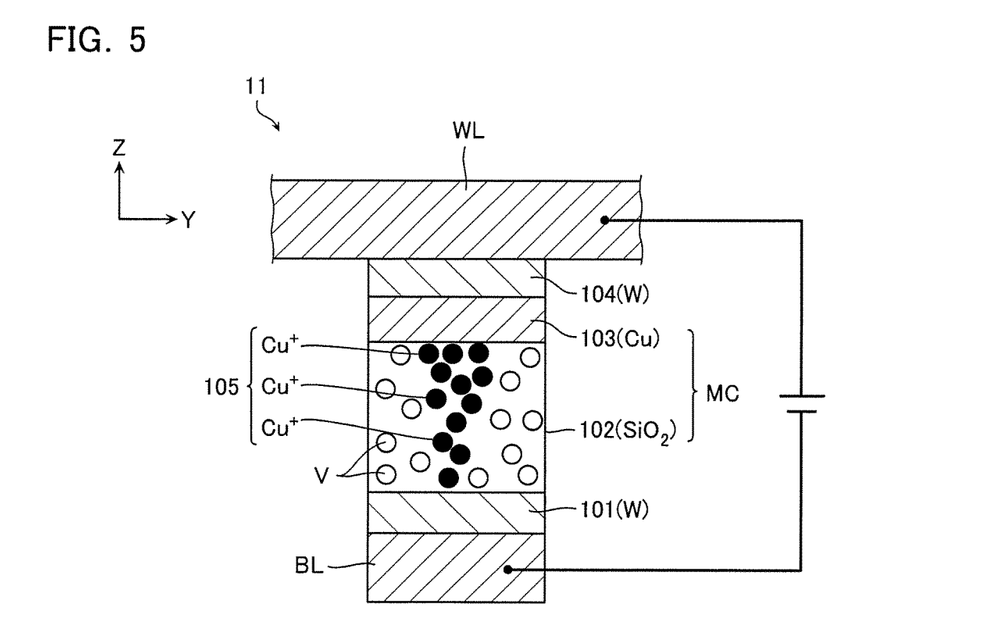
FIG. 5 is a schematic diagram for describing a set operation of the semiconductor memory device.

FIG. 5 is a schematic diagram for describing a set operation that performs transition of the memory cell MC from the high resistance state to the low resistance state. In the set operation, a voltage of a polarity in which the upper electrode 104 (anode, the second electrode) has a higher potential and the lower electrode 101 (cathode, the first electrode) has a lower potential (hereinafter referred to as a "first polarity") is applied. This causes the copper included in the metal film 103 to become positive ions to move toward the lower electrode 101, which is a negative electrode. In this respect, the copper ions $Cu^+$ diffuse in a direction of the lower electrode 101 through vacancies V within the resistance change film 102. Then, the copper ions $Cu^+$ combines with silicon atoms, oxygen atoms or similar atoms within the resistance change film 102 to form the filament 105 within the resistance change film 102. This constitutes the current path within the resistance change film 102, and the memory cell MC becomes the low resistance state.

The vacancy V within the resistance change film 102 is a part where an atom is missing within a lattice in which oxygen atoms are accurately arranged. The vacancy V is a point defect, which occurs when a lattice of a material that constitutes the resistance change film 102 is destroyed, for example, due to an application of electric field to the resistance change film 102. The copper ion $Cu^+$ has a large atomic size, therefore a barrier is high when moving between the lattices constituting the resistance change film 102. In view of this, the copper ion $Cu^+$ needs electrically high energy to move between the lattices. Here, if the vacancy V and a crystal defect are present at the proximity of the copper ion $Cu^+$, the copper ion $Cu^+$ is allowed to move through the vacancy V, thus lowering the barrier between the lattices. In view of this, the diffusion speed of the copper ion $Cu^+$ depends on the vacancy concentration. That is, by increasing the vacancy concentration, the diffusion of the copper ions $Cu^+$ with a low electrical energy supply is achieved.

The larger the following diffusion coefficient D is, the easier the copper ion $Cu^+$ moves.

$$D \propto \exp\left(-\frac{E_a - f(V)}{k_B T}\right) \qquad \text{Formula (1)}$$

$E_a$: diffusion barrier (potential energy), $f(V)$: variation amount of barrier height relative to electric field, $k_B$: Boltzmann constant, T: temperature, and V: electric field.

A description of the above formula (1) will be given.

Diffusibility is determined by a diffusion barrier $E_a$, a variation amount $f(V)$ of a barrier height relative to an electric field, and a temperature.

A description of the diffusion barrier Ea will be given. The copper ion $Cu^+$ passes through a position where a distance between the lattices is narrow when the copper ion $Cu^+$ is moving through a gap of the lattices. In this respect, the copper ion $Cu^+$ proceeds by pushing away nearby atoms, therefore the diffusion barrier Ea is present between the lattices. Here, when the vacancy V is present in the peripheral area of the copper ion $Cu^+$, a force needed to push away the nearby atoms decreases, therefore the diffusion barrier Ea between the lattices lowers.

A description of the variation amount f(V) of the barrier height relative to the electric field will be given. By applying the electric field V between the lower electrode 101 and the upper electrode 104, f(V) increases due to the occurrence of an electric force corresponding to the strength of the electric field V to the copper ion $Cu^+$, and the barrier height Ea-f(V) in the electric field direction lowers. As described above, the vacancy V reduces the diffusion barrier Ea of the copper ion $Cu^+$ to assist the diffusion of the copper ions $Cu^+$. Here, the number of the vacancy V at the proximity of the lower electrode 101 increases corresponding to the direction and the strength of the applied electric field. Such reason also lowers the barrier height Ea-f(V) in the electric field direction, and the copper ion $Cu^+$ diffuses easily within the resistance change film 102.

The absolute temperature T is a value indicating the Joule heat that is generated by a formation of the filament 105 within the resistance change film 102 causing a current flow within the resistance change film 102.

Figure 6:
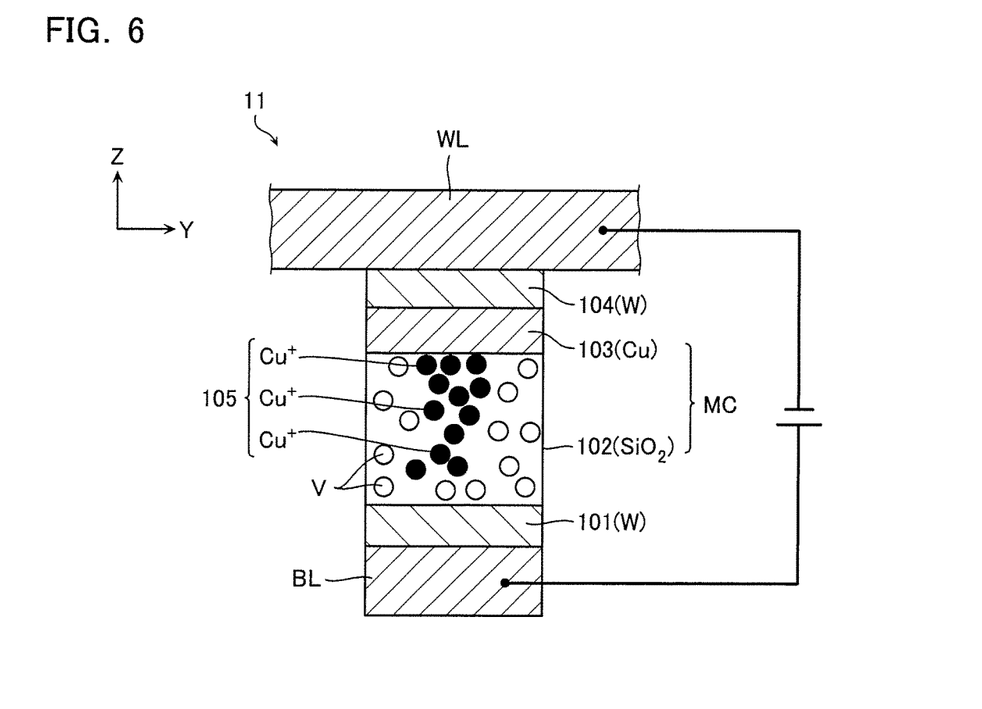
FIG. 6 is a schematic diagram for describing a reset operation of the semiconductor memory device.

FIG. 6 is a schematic diagram for describing a reset operation that performs transition of the memory cell MC from the low resistance state to the high resistance state. In the reset operation, a voltage of an inverse polarity of the first polarity in which the lower electrode 101 (cathode) has a higher potential and the upper electrode 104 (anode) has a lower potential (hereinafter referred to as a "second polarity") is applied. This causes the copper included in the filament 105 to become positive ions to move toward the upper electrode 104, which is a negative electrode. In this respect, the copper ions $Cu^+$ diffuse in a direction going away from the lower electrode 101 through the vacancies V within the resistance change film 102. This causes the filament 105 of the resistance change film 102 to be separated or disappear, and the current path disappears. Thus, the memory cell MC becomes the high resistance state.

Figure 7:
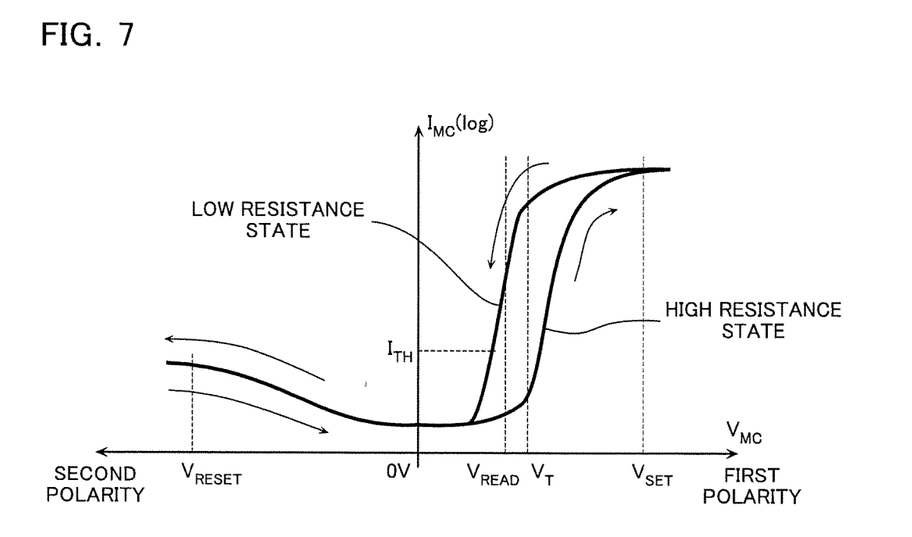
FIG. 7 is a graph illustrating current-voltage characteristics of the memory cell of the semiconductor memory device.

FIG. 7 is a schematic graph illustrating current-voltage characteristics of the memory cell MC. The horizontal axis indicates a voltage $V_{MC}$ applied between the lower electrode 101 and the upper electrode 104 of the memory cell MC. The vertical axis indicates a current $I_{MC}$ flown to the memory cell MC along a logarithmic axis.

First, a case where the voltage $V_{MC}$ of the first polarity is applied to the memory cell MC in the high resistance state will be described. In the case where the voltage $V_{MC}$ is increased from 0 V, the filament 105 is formed within the resistance change film 102 when the voltage $V_{MC}$ becomes larger than a transition voltage $V_T$, therefore the current $I_{MC}$ increases extremely. When the voltage $V_{MC}$ reaches a set voltage $V_{SET}$, the memory cell MC transitions from the high resistance state to the low resistance state, and the current $I_{MC}$ is saturated. The filament 105 is maintained even the voltage $V_{MC}$ is reduced to 0 V in this state because there is no external force to diffuse the atoms. Thus, the low resistance state of the memory cell MC is maintained.

Next, a case where the voltage $V_{MC}$ of the second polarity is applied to the memory cell MC in the low resistance state will be described. In the case where the voltage $V_{MC}$ is increased, the filament 105 is separated or disappears when the voltage $V_{MC}$ reaches a reset voltage $V_{RESET}$, therefore the memory cell MC transitions from the low resistance state to the high resistance state. The filament 105 is maintained to be in the separated or disappearing state even the voltage $V_{MC}$ is reduced to 0 V in this state, therefore the high resistance state is maintained. The current $I_{MC}$ hardly flows to the memory cell MC even the voltage $V_{MC}$ is applied to the second polarity of the memory cell MC.

When data is read from the memory cell MC, the voltage $V_{MC}$ is set to, for example, a reading voltage $V_{READ}$. The reading voltage $V_{READ}$ is a voltage of the first polarity and smaller than the transition voltage $V_T$. When the voltage $V_{MC}$ is the reading voltage $V_{READ}$, the memory cell MC in the high resistance state only has a current smaller than a threshold $I_{TH}$ flown, and the memory cell MC in the low resistance state has a current larger than the threshold $I_{TH}$ flown.

[Operation]

Figure 8:
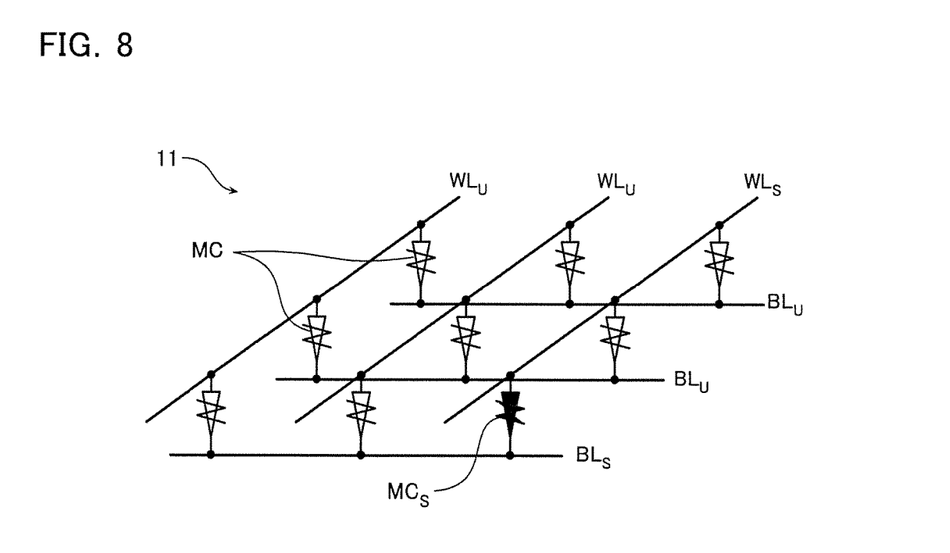
FIG. 8 is a circuit diagram for describing an operation of the semiconductor memory device.

FIG. 8 is a circuit diagram for describing an operation of the semiconductor memory device according to the embodiment. The following describes the cases where a set operation and a reset operation are performed to a selected memory cell $MC_S$ connected to a selected bit line $BL_S$ and a selected word line $WL_S$.

[Set Operation]

Figure 9:
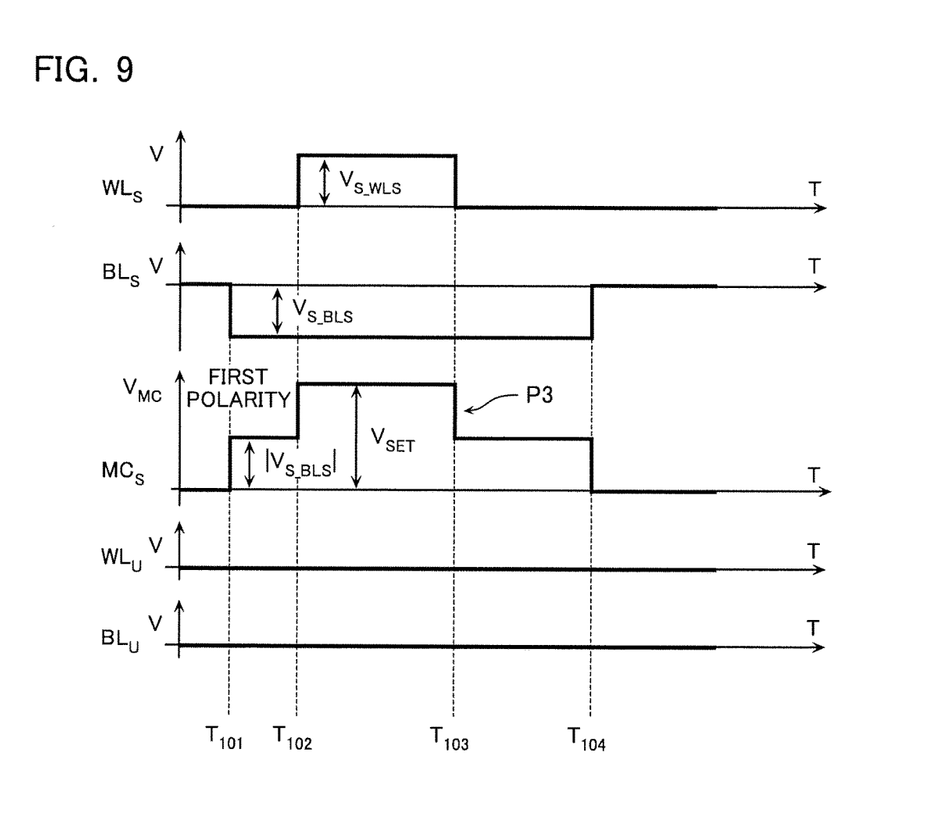
FIG. 9 is a timing diagram for describing the set operation of the semiconductor memory device.

FIG. 9 is a timing diagram for describing the set operation. FIG. 9 illustrates voltages applied to the selected word line $WL_S$, the selected bit line $BL_S$, the selected memory cell $MC_S$, a non-selected word line $WL_U$, and a non-selected bit line $BL_U$.

At Timing $T_{101}$, a selected bit line voltage $V_{S\_BLS}$ is applied to the selected bit line $BL_S$, and an intermediate potential between the selected bit line voltage $V_{S\_BLS}$ and the selected word line voltage $V_{S\_WLS}$, which will be described later, are applied to the selected word line $WL_S$, the non-selected word line $WL_U$, and the non-selected bit line $BL_U$. The selected bit line voltage $V_{S\_BLS}$ is a negative voltage. The selected bit line voltage $V_{S\_BLS}$ is set to a magnitude with which a non-selected memory cell connected to the non-selected word line $WL_U$ and the selected bit line $BL_S$ does not transition to the low resistance state. By applying these voltages, a voltage of the first polarity $|V_{S\_BLS}|$ is applied to the selected memory cell $MC_S$.

At Timing $T_{102}$, the selected word line voltage $V_{S\_WLS}$ is applied to the selected word line $WL_S$. The selected word line voltage $V_{S\_WLS}$ is a positive voltage. The selected word line voltage $V_{S\_WLS}$ is set to a magnitude with which the non-selected memory cell connected to the selected word line $WL_S$ and the non-selected bit line $BL_U$ does not transition to the low resistance state. By doing this, a writing pulse (third pulse) P3 is applied to the selected memory cell $MC_S$. The voltage of the writing pulse P3 is the set voltage $V_{SET}$, which has been described with reference to FIG. 7. This causes the copper ions $Cu^+$ within the selected memory cell $MC_S$ to approach the lower electrode 101 through the vacancies V to transition the selected memory cell $MC_S$ to be in the low resistance state.

At Timing $T_{103}$, the voltage of the selected word line $WL_S$ is set to 0 V. In other words, the application of the selected word line voltage $V_{S\_WLS}$ is terminated. By doing this, the voltage applied to the selected memory cell $MC_S$ becomes $|V_{S\_BLS}|$.

At Timing $T_{104}$, the voltage of the selected bit line $BL_S$ is set to 0 V. In other words, the application of the selected bit line voltage $V_{S\_BLS}$ is terminated. By doing this, the voltage applied to the selected memory cell $MC_S$ becomes 0 V.

[Reset Operation]

Figure 10:
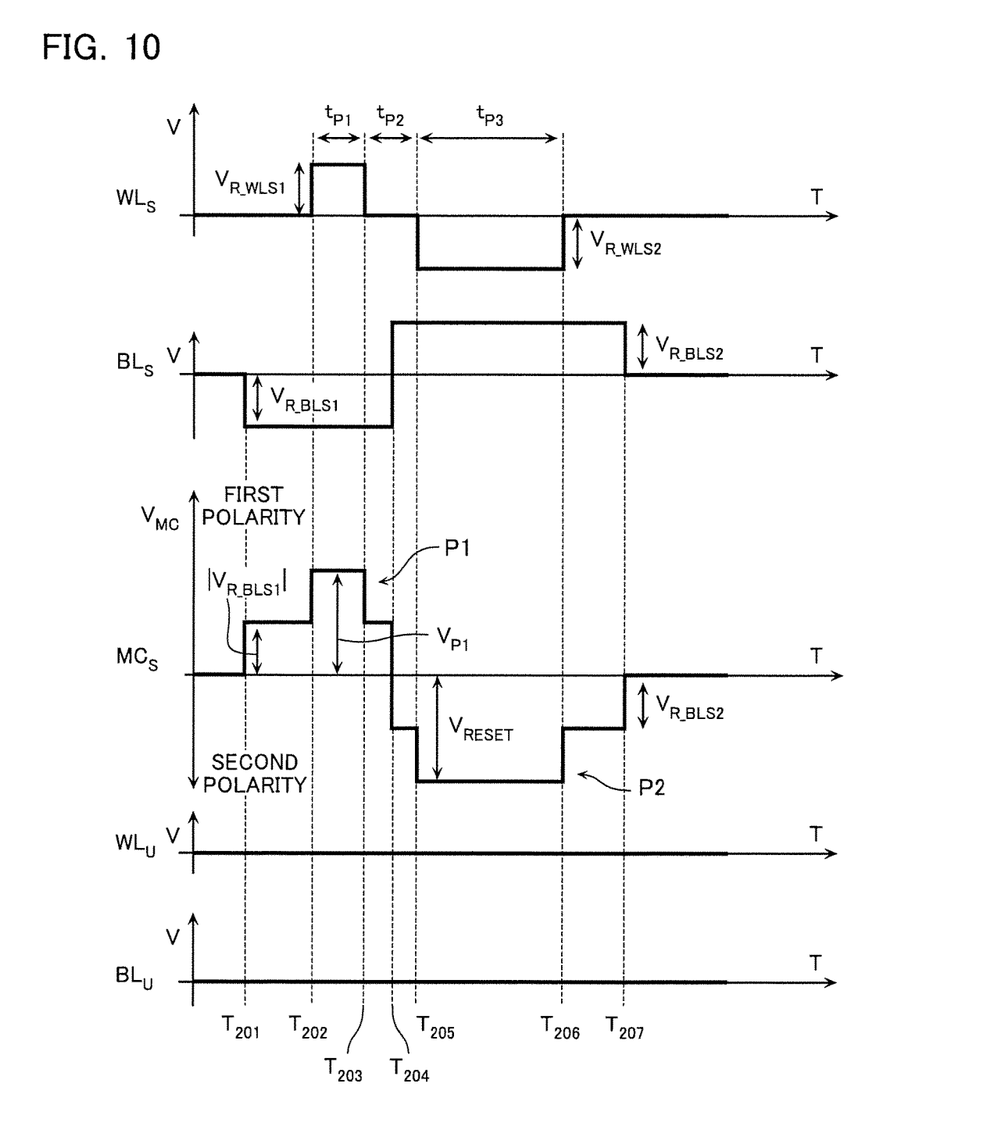
FIG. 10 is a timing diagram for describing the reset operation of the semiconductor memory device.

FIG. 10 is a timing diagram for describing the reset operation according to the embodiment. FIG. 10 illustrates voltages applied to the selected word line $WL_S$, the selected bit line $BL_S$, the selected memory cell $MC_S$, the non-selected word line $WL_U$, and the non-selected bit line $BL_U$.

At Timing $T_{201}$, a selected bit line voltage $V_{R\_BLS1}$ (third voltage) is applied to the selected bit line $BL_S$, and an intermediate potential between a selected bit line voltage $V_{R\_BLS2}$, which will be described later, and the selected word line voltage $V_{R\_WLS2}$, which will be described later, are applied to the selected word line $WL_S$, the non-selected word line $WL_U$, and the non-selected bit line $BL_U$. The selected bit line voltage $V_{R\_BLS1}$ is a negative voltage. The selected bit line voltage $V_{R\_BLS1}$ is set to a magnitude with which the non-selected memory cell connected to the non-selected word line $WL_U$ and the selected bit line $BL_S$ does not transition to the low resistance state. By applying these voltages, a voltage of the first polarity $|V_{R\_BLS1}|$ is applied to the selected memory cell $MC_S$.

At Timing $T_{202}$, a selected word line voltage $V_{R\_WLS1}$ (first voltage) is applied to the selected word line $WL_S$. The selected word line voltage $V_{R\_WLS1}$ is a positive voltage. The selected word line voltage $V_{R\_WLS1}$ is set to, for example, a magnitude with which the non-selected memory cell connected to the selected word line $WL_S$ and the non-selected bit line $BL_U$ does not transition to the low resistance state. By doing this, the first pulse P1 is applied to the selected memory cell $MC_S$. The first pulse P1 includes a voltage $V_{P1}$ of the first polarity. This causes the current flow in the selected memory cell $MC_S$ to generate the Joule heat, for example. The vacancies V within the selected memory cell $MC_S$ are attracted to the lower electrode 101 to increase the concentration of the vacancies V at the proximity of the lower electrode 101. The voltage $V_{P1}$, for example, has a magnitude of equal to or more than 30% and equal to or less than 80% of the third pulse set voltage $V_{SET}$ (FIG. 9).

At Timing $T_{203}$, the voltage of the selected word line $WL_S$ is reduced to the intermediate potential between the selected bit line voltage $V_{R\_BLS2}$ and the selected word line voltage $V_{R\_WLS2}$. In other words, the application of the selected word line voltage $V_{R\_WLS1}$ is terminated. By doing this, the voltage applied to the selected memory cell $MC_S$ becomes $|V_{R\_BLS1}|$.

At Timing $T_{204}$, the selected bit line voltage $V_{R\_BLS2}$ (fourth voltage) is applied to the selected bit line $BL_S$. The selected bit line voltage $V_{R\_BLS2}$ is a positive voltage. The selected bit line voltage $V_{R\_BLS2}$ is set to a magnitude with which the non-selected memory cell connected to the non-selected word line $WL_U$ and the selected bit line $BL_S$ does not transition to the high resistance state. By doing this, a voltage $V_{R\_BLS2}$ of the second polarity is applied the selected memory cell $MC_S$.

At Timing $T_{205}$, the selected word line voltage $V_{R\_WLS2}$ (second voltage) is applied to the selected word line $WL_S$. The selected word line voltage $V_{R\_WLS2}$ is a negative voltage. The selected word line voltage $V_{R\_WLS2}$ is set to a magnitude with which the non-selected memory cell connected to the selected word line $WL_S$ and the non-selected bit line $BL_U$ does not transition to the high resistance state. By doing this, the second pulse P2 is applied to the selected memory cell $MC_S$. The voltage of the second pulse P2 is a reset voltage $V_{RESET}$ (FIG. 7) that has the second polarity. This causes the copper ions $Cu^+$ within the selected memory cell $MC_S$ to separate from the lower electrode 101 through the vacancies V to cause the selected memory cell $MC_S$ to be the high resistance state.

At Timing $T_{206}$, the voltage of the selected word line $WL_S$ is increased to the intermediate potential between the selected bit line voltage $V_{R\_BLS2}$ and the selected word line voltage $V_{R\_WLS2}$. In other words, the application of the selected word line voltage $V_{R\_WLS2}$ is terminated. By doing this, the voltage applied to the selected memory cell $MC_S$ becomes $V_{R\_BLS2}$.

At Timing $T_{207}$, the voltage of the selected bit line $BL_S$ is reduced to the intermediate potential between the selected bit line voltage $V_{R\_BLS2}$ and the selected word line voltage $V_{R\_WLS2}$. In other words, the application of the selected bit line voltage $V_{R\_BLS2}$ is terminated. By doing this, the voltage applied to the selected memory cell $MC_S$ becomes 0 V.

[Effect]

Figure 11:
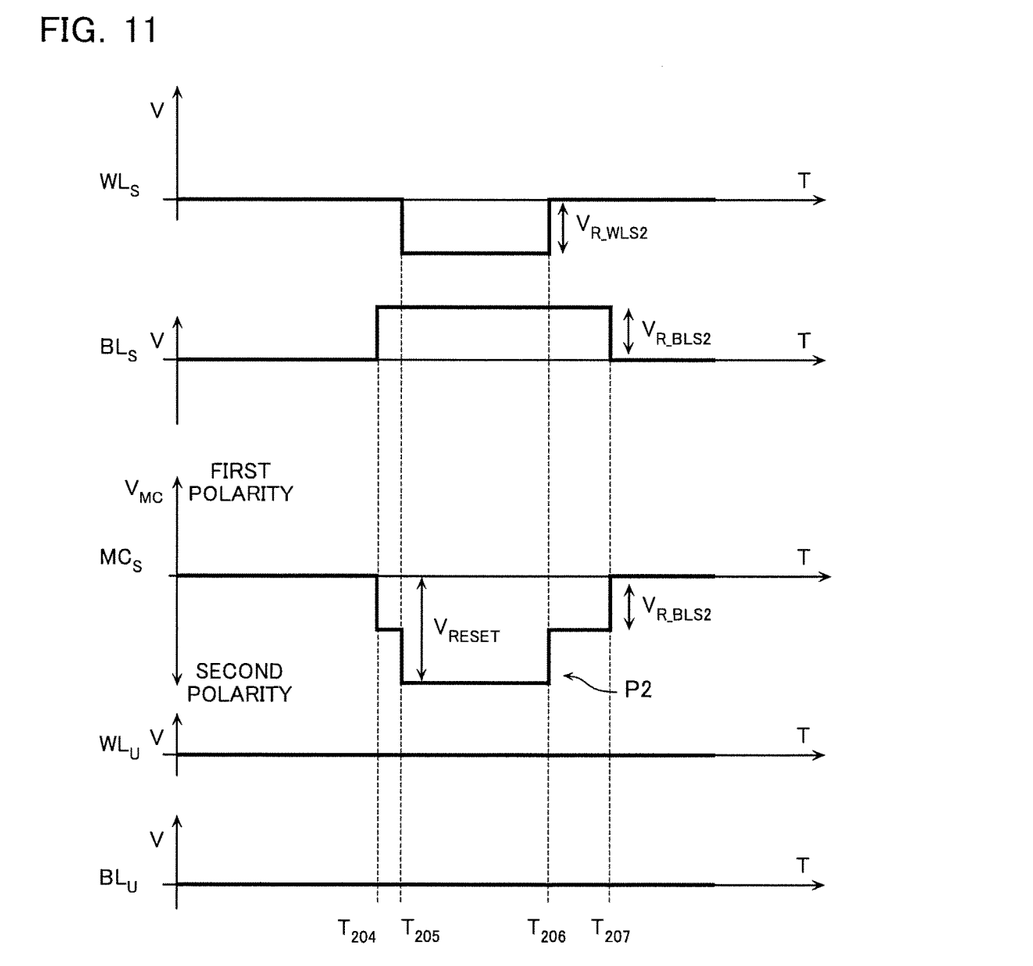
FIG. 11 is a timing diagram for describing a reset operation of a semiconductor memory device according to a comparative example.

FIG. 11 is a timing diagram for describing a reset operation according to a comparative example. FIG. 11 illustrates voltages applied to the selected word line $WL_S$, the selected bit line $BL_S$, the selected memory cell $MC_S$, the non-selected word line $WL_U$, and the non-selected bit line $BL_U$. In the following description, a part similar to FIG. 10 is attached with an identical reference numeral and its explanation is omitted.

In the reset operation according to the comparative example, the negative selected bit line voltage $V_{R\_BLS1}$ (third voltage) is not applied to the selected bit line $BL_S$, and the positive selected word line voltage $V_{R\_WLS1}$ (first voltage) is not applied to the selected word line $WL_S$. Accordingly, the selected memory cell $MC_S$ is not applied with the first pulse P1 of the first polarity.

As described above, even the voltage of the second polarity is applied to the memory cell MC, the current does not flow. In other words, in order to increase the temperature T by heating the filament 105 with the Joule heat, the voltage of the first polarity needs to be applied. Accordingly, in the comparative example, the current does not flow to the selected memory cell $MC_S$ and the Joule heat is not generated. Additionally, in the comparative example, the vacancy concentration at the proximity of the lower electrode 101 is relatively low. In such an aspect, a phenomenon where the selected memory cell $MC_S$ does not transition to the high resistance state (reset failure) sometimes occurs in spite of applying the reset voltage $V_{RESET}$ of the second polarity to the selected memory cell $MC_S$.

Therefore, in the reset operation according the embodiment, as described with reference to FIG. 10, the first pulse P1 having the voltage of the first polarity is applied before the second pulse P2 having the voltage of the second polarity is applied. Accordingly, the current is flown to the selected memory cell $MC_S$ before the second pulse P2 is applied to generate the Joule heat and to increase the diffusion coefficient D of the copper ion $Cu^+$, thus accelerating the diffusion speed of the copper ion $Cu^+$. This reduces the occurrence of the reset failure to ensure the selected memory cell $MC_S$ transitioning to the high resistance state preferably.

Additionally, applying the first pulse P1 having the voltage of the first polarity ensures the facilitated move of the copper ion $Cu^+$ by increasing the concentration of the vacancy V at the proximity of the lower electrode 101 that significantly contribute to the disappearance of the current path to increase the number of sites where the copper ion $Cu^+$ is movable. This reduces the occurrence of the reset failure to ensure the selected memory cell $MC_S$ transitioning to the high resistance state preferably.

Note that, in the reset operation, the copper ion $Cu^+$ is moved to a direction separating from the lower electrode 101. Accordingly, at least, the total amount of the copper ions $Cu^+$ that move to a direction approaching the lower electrode 101 is less than the total amount of the copper ions Cu+ that move to the direction separating from the lower electrode 101. Accordingly, the product of an amplitude (voltage $V_{p1}$) and a pulse width $t_{p1}$ of the first pulse P1 is less than the product of an amplitude (reset voltage $V_{RESET}$) and a pulse width $t_{p3}$ of the second pulse P2.

In order to perform the reset operation using the Joule heat and the vacancy V, it is preferable that the second pulse P2 is applied immediately after the first pulse P1 is applied to form the filament 105 and generate the Joule heat. For example, a time $t_{P2}$ from the end of the first pulse P1 application to the start of the second pulse P2 application may be within 100 nsec.

Second Embodiment

Figure 12:
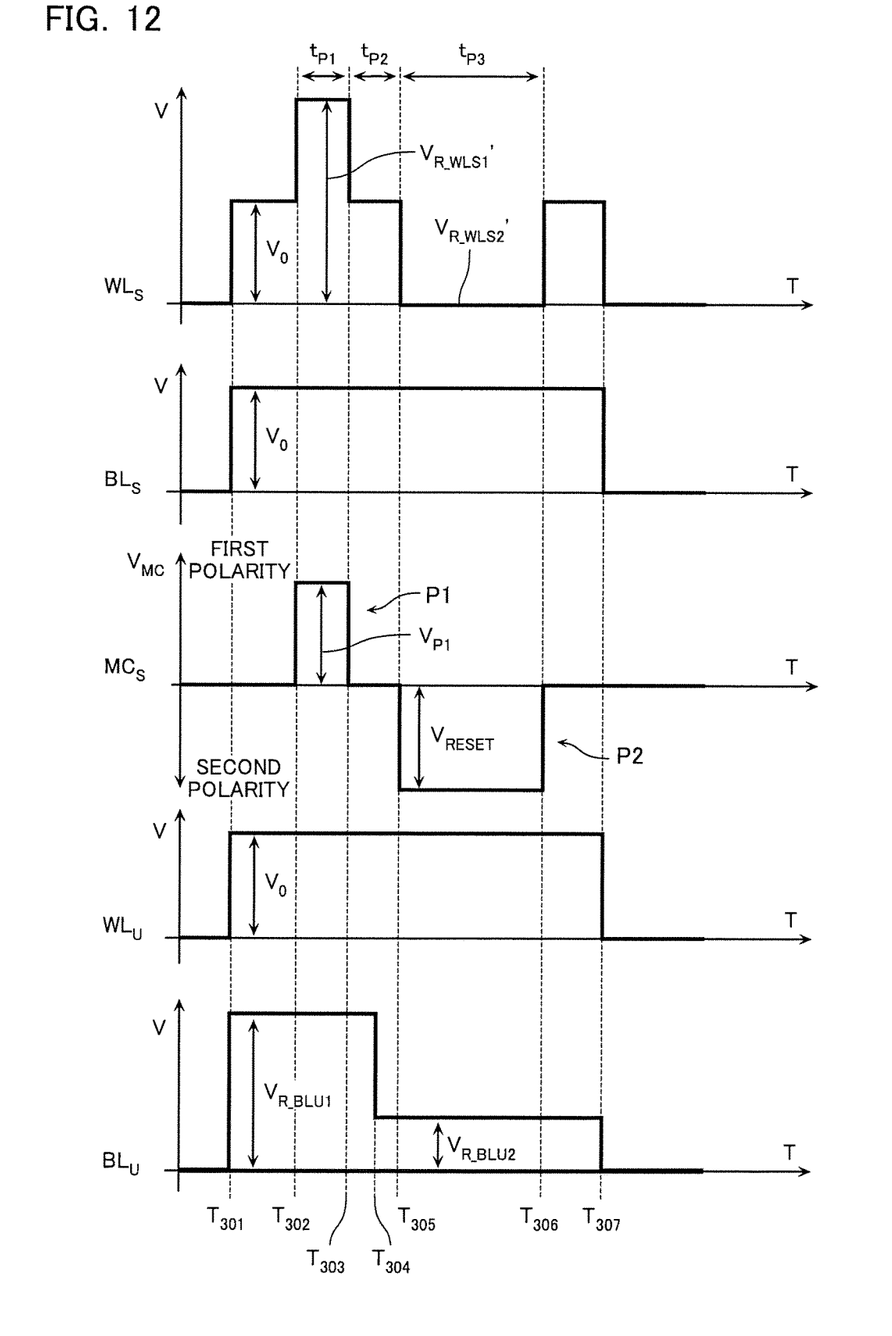
FIG. 12 is a timing diagram for describing a reset operation according to a second embodiment.

FIG. 12 is a timing diagram for describing the reset operation according to a second embodiment. FIG. 12 illustrates voltages applied to the selected word line $WL_S$, the selected bit line $BL_S$, the selected memory cell $MC_S$, the non-selected word line $WL_U$, and the non-selected bit line $BL_U$. in the following description, a part similar to the first embodiment is attached with an identical reference numeral and its explanation is omitted.

As described with reference to FIG. 10, in the reset operation according to the first embodiment, the intermediate potential between the selected bit line voltage $V_{R\_BLS2}$ and the selected word line voltage $V_{R\_WLS2}$ is approximately 0 V, and a negative voltage is applied to the selected bit line $BL_S$ and the selected word line $WL_S$. On the other hand, according to the embodiment, as illustrated in FIG. 12, an intermediate potential between the selected bit line voltage ($V_0$) and the selected word line voltage $V_{R\_WLS2}'$ is a positive voltage, and the negative voltage is not applied to the selected word line $WL_S$, the selected bit line $BL_S$, the non-selected word line $WL_U$, and the non-selected bit line $BL_U$.

At Timing $T_{301}$, the voltage $V_0$ is applied to the selected word line $WL_S$, the selected bit line $BL_S$, and the non-selected word line $WL_U$. The non-selected bit line voltage $V_{R\_BLU1}$ (fifth voltage) is applied to the non-selected bit line $BL_U$. The voltage $V_0$ is the positive voltage. The non-selected bit line voltage $V_{R\_BLU1}$ is a positive voltage larger than the voltage $V_0$, and is set to a magnitude with which the non-selected memory cell connected to the non-selected bit line $BL_U$ does not transition to the low resistance state.

At Timing $T_{302}$, the selected word line voltage $V_{R\_WLS1}'$ (first voltage) is applied to the selected word line $WL_S$. The selected word line voltage $V_{R\_WLS1}'$ is a positive voltage larger than the voltage $V_0$. By doing this, the first pulse P1 is applied to the selected memory cell $MC_S$.

At Timing $T_{303}$, the voltage of the selected word line $WL_S$ is reduced to $V_0$. By doing this, the voltage applied to the selected memory cell $MC_S$ becomes 0 V.

At Timing $T_{304}$, the voltage of the non-selected bit line $BL_U$ is reduced to the non-selected bit line voltage $V_{R\_BLU2}$ (sixth voltage) from the non-selected bit line voltage $V_{R\_BLU1}$ (fifth voltage). The non-selected bit line voltage $V_{R\_BLU2}$ is a positive voltage smaller than the non-selected bit line voltage $V_{R\_BLU1}$ and the voltage $V_0$. The non-selected bit line voltage $V_{R\_BLU2}$ is set to a magnitude with which the non-selected memory cell connected to the non-selected word line $WL_U$ and the non-selected bit line $BL_U$ does not transition to the low resistance state.

At Timing $T_{305}$, the selected word line voltage $V_{R\_WLS2}'$ (second voltage) is applied to the selected word line $WL_S$. The selected word line voltage $V_{R\_WLS2}'$ is a voltage lower than the voltage $V_0$ and the non-selected bit line voltage $V_{R\_BLU2}$. The selected word line voltage $V_{R\_WLS2}'$ is set such that the difference between the voltage $V_0$ and the selected word line voltage $V_{R\_WLS2}'$ is the reset voltage $V_{RESET}$ (FIG. 7). The selected word line voltage $V_{R\_WLS2}'$ is set to a magnitude with which the non-selected memory cell connected to the selected word line $WL_S$ and the non-selected bit line $BL_U$ does not transition to the high resistance state. In the example illustrated in FIG. 12, the selected word line voltage $V_{R\_WLS2}'$ is 0 V. By doing this, the second pulse P2 is applied to the selected memory cell $MC_S$.

At Timing $T_{306}$, the voltage of the selected word line $WL_S$ is increased to $V_0$. By doing this, the voltage applied to the selected memory cell $MC_S$ becomes 0 V.

At Timing $T_{307}$, the voltages of the selected word line $WL_S$, the selected bit line $BL_S$, the non-selected word line $WL_U$, and the non-selected bit line $BL_U$ are reduced to 0 V.

Third Embodiment

Figure 13:
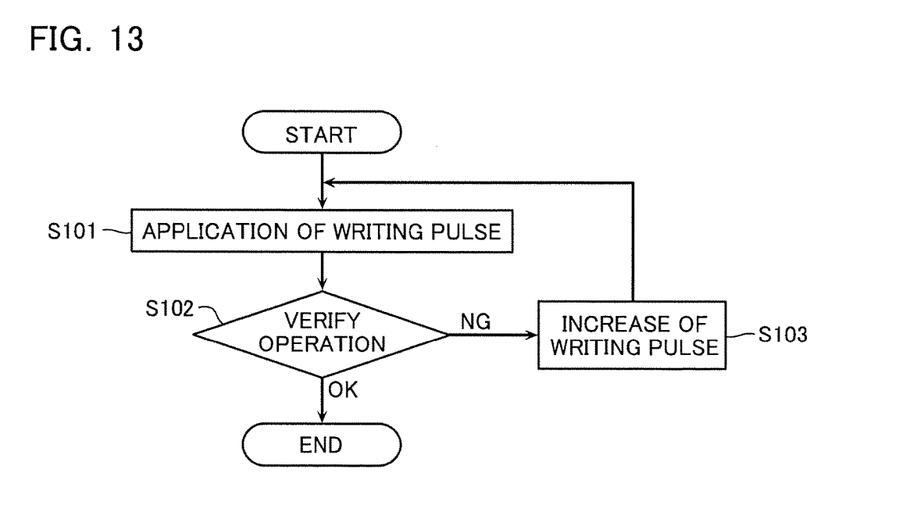
FIG. 13 is a flowchart for describing a set operation according to a third embodiment.
Figure 14:
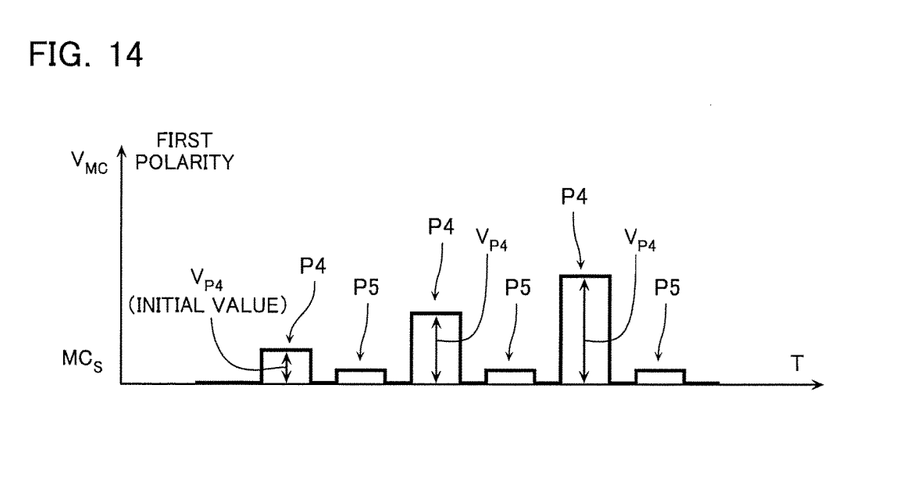
FIG. 14 is a timing diagram for describing the set operation.

[Set Operation]
FIG. 13 is a flowchart for describing a set operation according to a third embodiment. FIG. 14 is a timing diagram for describing the set operation. In the following description, a part similar to the first embodiment is attached with an identical reference numeral and its explanation is omitted.

As described with reference to FIG. 9, in the set operation according to the first embodiment, the voltage $V_{SET}$ of the writing pulse (third pulse) P3 has a constant magnitude.

On the other hand, in the third embodiment, as illustrated in FIG. 13 and FIG. 14, the writing pulse (fourth pulse) P4 is applied to the selected memory cell $MC_S$ for several times, and every time the application of the writing pulse P4 is terminated, a verify operation is performed to confirm whether the selected memory cell $MC_S$ is in a desired state or not. The set operation is terminated at the point when the selected memory cell $MC_S$ is in the desired state. The voltage $V_{P4}$ of the writing pulse (fourth pulse) P4 is increased. In the examples illustrated in FIG. 13 and FIG. 14, the desired state is the low resistance state.

At Step S101, the writing pulse P4 is applied to the selected memory cell $MC_S$. The voltage $V_{P4}$ of the writing pulse P4 is the voltage of the first polarity.

At Step S102, the verify operation is performed. In the verify operation, as illustrated in FIG. 14, a fifth pulse P5 is applied to the selected memory cell $MC_S$, and whether the selected memory cell $MC_S$ is transitioned to the low resistance state or not is confirmed. The fifth pulse P5 has a voltage of approximately the reading voltage $V_{READ}$ (FIG. 7), for example. At Step S102, when the memory cell MC is transitioned to the low resistance state, the set operation is terminated. When the memory cell MC is not transitioned to the low resistance state, Step S103 is performed.

At Step S103, the voltage $V_{P4}$ of the writing pulse P4 is increased. After Step S103 is performed, Step S101 and Step S102 are performed again. Accordingly, as illustrated in FIG. 14, the voltage $V_{P4}$ of the writing pulse P4 increases.

[Reset Operation]
The reset operation according to the embodiment is performed similarly to the first or the second embodiment. However, according to the embodiment, a magnitude of the voltage $V_{P1}$ of the first pulse P1 (FIG. 10 and FIG. 12) is, for example, the magnitude that is equal to or more than 80% of an initial value of the voltage $V_{P4}$ of the writing pulse P4.

Fourth Embodiment

Figure 15:
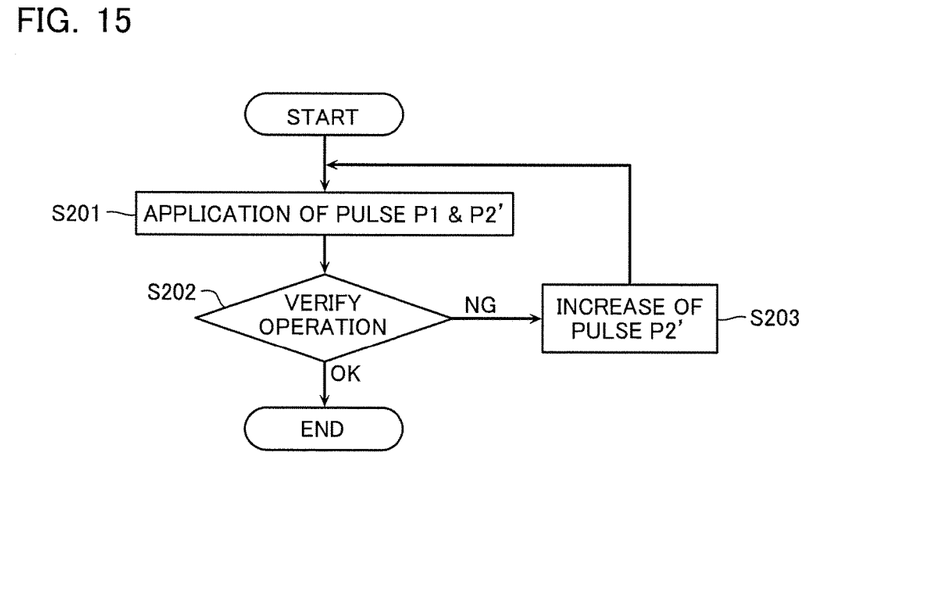
FIG. 15 is a flowchart for describing a reset operation according to a fourth embodiment.
Figure 16:
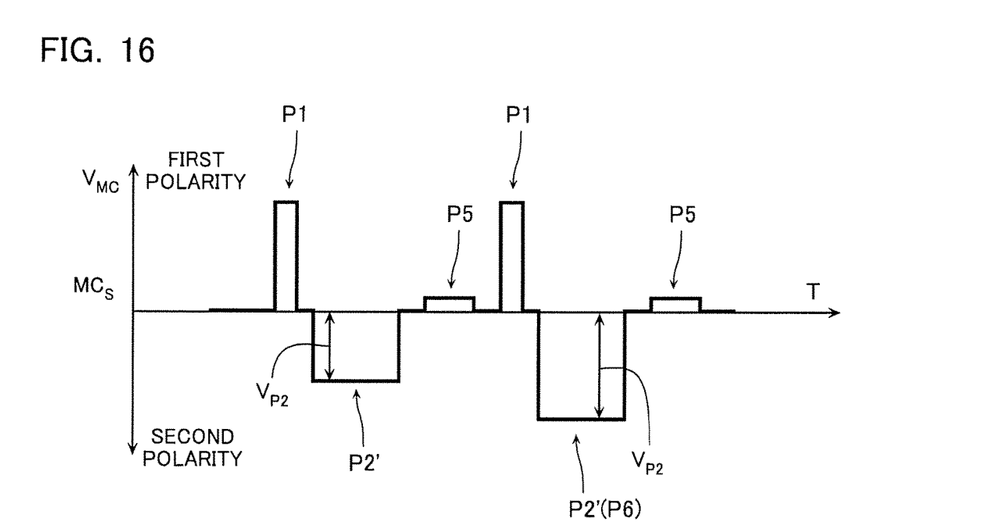
FIG. 16 is a timing diagram for describing the reset operation.

FIG. 15 is a flowchart for describing a reset operation according to a fourth embodiment. FIG. 16 is a timing diagram for describing the reset operation. In the following description, apart similar to the first embodiment is attached with an identical reference numeral and its explanation is omitted.

As described with reference to FIG. 10, in the reset operation according to the first embodiment, the voltage $V_{RESET}$ of the second pulse P2 has a constant magnitude.

On the other hand, in the fourth embodiment, as illustrated in FIG. 15 and FIG. 16, the selected memory cell $MC_S$ is applied with the first pulse P1 and the second pulse P2' for several times, and every time the application of the second pulse P2' is terminated, the verify operation is performed to confirm whether the selected memory cell $MC_S$ is in a desired state or not. The reset operation is terminated at the point when the selected memory cell $MC_S$ is in the desired state. The magnitude of the voltage $V_{P2}$ of the second pulse P2' is increased. In the examples illustrated in FIG. 15 and FIG. 16, the desired state is the high resistance state.

At Step S201, the first pulse P1 and the second pulse P2' is applied to the selected memory cell $MC_S$. The second pulse P2' has the voltage of the second polarity. The voltage $V_{P2}$ of the second pulse P2' is smaller than the reset voltage $V_{RESET}$ at a phase of the initial value.

At Step S202, the verify operation is performed. In the verify operation, as illustrated in FIG. 16, the fifth pulse P5 is applied to the selected memory cell $MC_S$, and whether the selected memory cell $MC_S$ is transitioned to the high resistance state or not is confirmed. At Step S202, when the memory cell MC is transitioned to the high resistance state, the reset operation is terminated. When the memory cell MC is not transitioned to the high resistance state, Step S203 is performed.

At Step S203, the voltage $V_{P2}$ of the second pulse P2' is increased. After performing step S203, step S201 and step S202 are performed again. Accordingly, the magnitude of the voltage $V_{P2}$ of the second pulse P2' increases as illustrated in FIG. 16. The second pulse P2' having a voltage value amplified in such a manner may be referred to as a sixth pulse P6.

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a first electrode;
a second electrode;
a memory cell provided between the first electrode and the second electrode, the memory cell including a metal containing film and a resistance change film; and
a control circuit that applies a voltage between the first electrode and the second electrode to perform transition of a resistive state of the memory cell, wherein
the control circuit performs a first reset operation, a verify operation and a second reset operation,
the first reset operation is performed by applying a first pulse having a voltage of a first polarity to the memory cell, and applying a second pulse having a voltage of a second polarity that is an inverse of the first polarity to the memory cell after applying the first pulse,
the verify operation confirms whether the memory cell is in a desired state, performed by applying the memory cell with a verify pulse having the first polarity,
the second reset operation is performed by applying a sixth pulse having a larger voltage than a voltage of the second pulse and a second polarity, and
the control circuit performs the verify operation every time the first reset operation terminates and performs the second reset operation when the memory cell is out of a desired state after performing the verify operation.

2. The semiconductor memory device according to claim 1, wherein:
the control circuit performs a set operation by applying a third pulse having a voltage of the first polarity to the memory cell when transitioning the memory cell to a low resistance state; and
the voltage of the first pulse has a lower value than the voltage of the third pulse.

3. The semiconductor memory device according to claim 2, wherein
the voltage of the first pulse has a magnitude of equal to or more than 30% and equal to or less than 80% of the voltage of the third pulse.

4. The semiconductor memory device according to claim 1, wherein:
the control circuit applies a further pulse having a voltage of the first polarity to the memory cell when transitioning the memory cell to the low resistance state; and
the voltage of the first pulse has a magnitude of equal to or more than 80% of the voltage of the further pulse.

5. The semiconductor memory device according to claim 1, wherein
a product of an amplitude and a pulse width of the first pulse is smaller than a product of an amplitude and a pulse width of the second pulse.

6. The semiconductor memory device according to claim 1, wherein
the control circuit starts to apply the second pulse within 100 nsec since termination of applying the first pulse.

7. The semiconductor memory device according to claim 1, wherein:
the resistance change film is provided between the first electrode and the second electrode; and
the metal containing film is provided between the resistance change film and the second electrode.

8. The semiconductor memory device according to claim 1, wherein
the control circuit, when transitioning the memory cell to a high resistance state,
applies a positive first voltage to the second electrode, and
applies a second voltage lower than the first voltage to the second electrode after applying the first voltage.

9. The semiconductor memory device according to claim 8, wherein
the control circuit
applies a negative third voltage to the first electrode before starting to apply the first voltage,
increases the voltage of the first electrode to a positive fourth voltage from the third voltage before starting to apply the second voltage after termination of applying the first voltage, and
terminates applying the fourth voltage after termination of applying the second voltage.

10. A semiconductor memory device, comprising:
a first wiring;
a second wiring intersecting with the first wiring;
a memory cell provided between the first wiring and the second wiring, the memory cell including a metal containing film and a resistance change film; and
a control circuit that applies any voltage to the first wiring and the second wiring, wherein
the control circuit, when transitioning the memory cell to a high resistance state, between the first wiring and the second wiring,
  applies a first pulse having a voltage of a first polarity and
  applies a second pulse having a voltage of a second polarity that is an inverse of the first polarity after applying the first pulse,
the first pulse is applied by:
  applying a negative third voltage to the second wiring; and
  applying a positive first voltage to the first wiring while the third voltage is applied, and
the second pulse is applied by:
  increasing the voltage of the second wiring to a positive fourth voltage from the third voltage after termination of applying the first voltage;
  applying a second voltage lower than the first voltage to the first wiring after increasing the voltage of the second wiring to the fourth voltage; and
  terminating applying the fourth voltage after termination of applying the second voltage.

11. The semiconductor memory device according to claim 10, wherein:
the control circuit applies a third pulse having a voltage of the first polarity between the first wiring and the second wiring when transitioning the memory cell to a low resistance state; and
the voltage of the first pulse has a magnitude of equal to or more than 30% of the voltage of the third pulse.

12. The semiconductor memory device according to claim 10, wherein:
the control circuit applies a further pulse having the voltage of the first polarity between the first wiring and the second wiring when transitioning the memory cell to the low resistance state; and
the voltage of the first pulse has a magnitude of equal to or more than 80% of the voltage of the further pulse.

13. The semiconductor memory device according to claim 10, wherein
a product of an amplitude and a pulse width of the first pulse is smaller than a product of an amplitude and a pulse width of the second pulse.

14. The semiconductor memory device according to claim 10, wherein
the control circuit starts to apply the second pulse within 100 nsec since termination of applying the first pulse.

15. The semiconductor memory device according to claim 10, wherein:
the resistance change film is provided between the first wiring and the second wiring; and
the metal containing film is provided between the resistance change film and the first wiring.

* * * * *